United States Patent [19]
Hamilton et al.

[11] Patent Number: 5,565,866
[45] Date of Patent: Oct. 15, 1996

[54] DIGITAL-TO-ANALOG CONVERTER WITH VOLTAGE DEFINED BY JOSEPHSON FREQUENCY VOLTAGE RELATION

[75] Inventors: Clark A. Hamilton; Charles J. Burroughs; Richard L. Kautz, all of Boulder, Colo.

[73] Assignee: The United States of America as represented by the Secretary of Commerce, Washington, D.C.

[21] Appl. No.: 317,328

[22] Filed: Oct. 4, 1994

[51] Int. Cl.$^6$ .................................................... H03M 1/00
[52] U.S. Cl. ........................... 341/133; 341/144; 341/145
[58] Field of Search ................................... 341/133, 145, 341/144

[56] References Cited

U.S. PATENT DOCUMENTS

| | | |
|---|---|---|
| 4,227,096 | 10/1980 | Holdeman et al. . |
| 4,489,424 | 12/1984 | Sone . |
| 4,856,099 | 8/1989 | Stebbins . |
| 5,114,912 | 5/1992 | Benz . |
| 5,128,675 | 7/1992 | Harada ................................. 341/133 |
| 5,189,420 | 2/1993 | Eddy et al. . |
| 5,351,049 | 9/1994 | Lee et al. . |
| 5,398,030 | 3/1995 | Sandell ................................. 341/133 |

OTHER PUBLICATIONS

Hamilton, Clark A. (1992) "Josephson Voltage Standard Based on Single–Flux–Quantum Voltage Multipliers," *IEEE Transactions on Applied Superconductivity,* 3 (vol. 2):139–142.

Tadashi et al., (1983) "High–Accuracy Josephson Potentiometer," *IEEE Transactions on Instrumentation and Measurement,* 1 (IM–32):267–271.

Joly et al., (1979) "Computer stimulation of a voltage cell using a Josephson junction," *IEEE Journal of Solid–State Circuits* 4 (SC–14):685–689.

Borovitskii et al. (1985) "Increasing the working voltage across chains of Josephson junctions," *Sov. Tech. Phys. Lett.* 11 (6):275–277.

Primary Examiner—Jeffrey A. Gaffin
Assistant Examiner—Jason L. W. Kost
Attorney, Agent, or Firm—Charles E. Rohrer

[57] ABSTRACT

A superconducting integrated circuit that uses a digital input to rapidly select any one of several thousand quantized output voltages. The voltages are generated directly by microwave synchronized Josephson junctions and are as accurate as the externally generated microwave frequency. The circuit makes possible fast voltage comparisons and the digital synthesis of ultra-accurate ac waveforms whose amplitude derives directly from the internationally accepted definition of the volt.

16 Claims, 7 Drawing Sheets

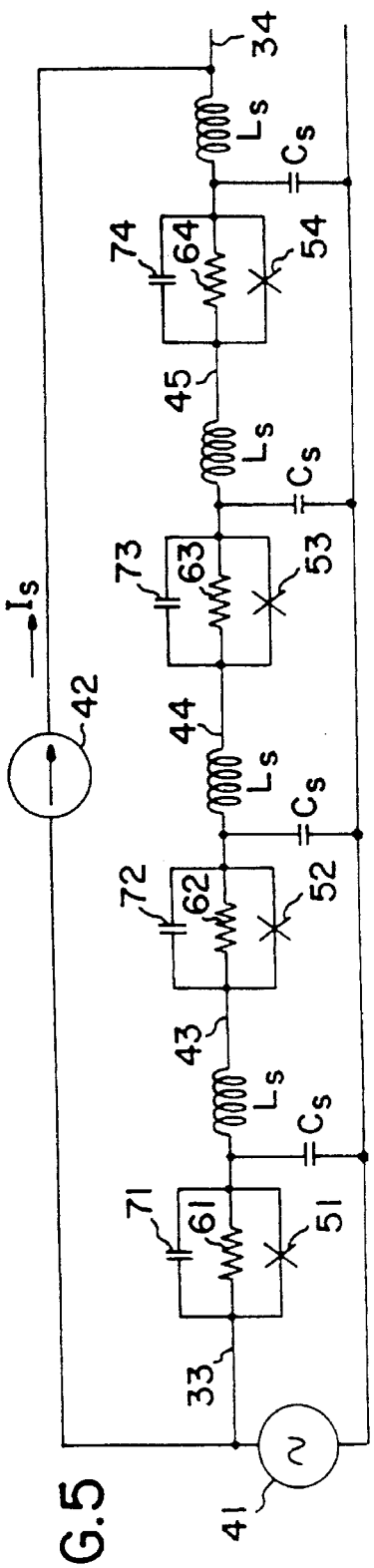
FIG.5
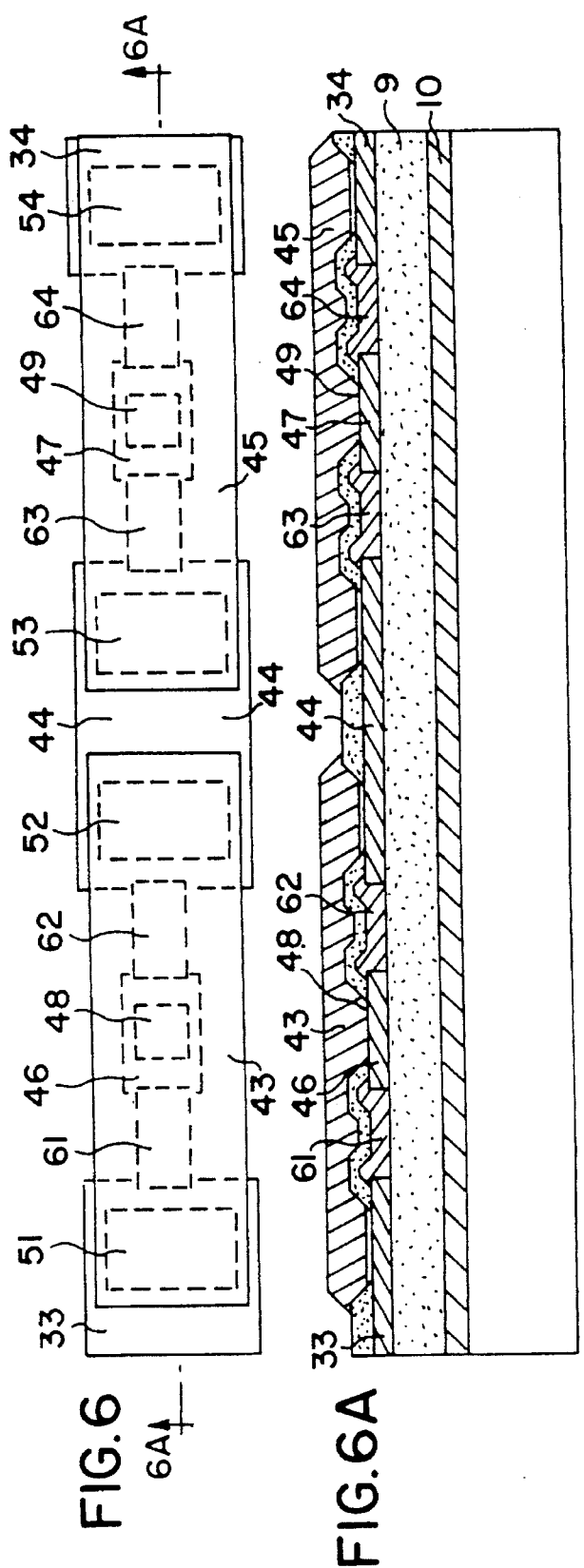
FIG.6
FIG.6A

5,565,866

DIGITAL-TO-ANALOG CONVERTER WITH VOLTAGE DEFINED BY JOSEPHSON FREQUENCY VOLTAGE RELATION

The present invention relates to superconducting integrated electrical circuits and more particularly to digital-to-analog converters utilizing Josephson junctions for high accuracy.

BACKGROUND OF THE INVENTION

When a high frequency current is driven through a Josephson junction it generates a series of constant voltage steps in its low frequency current versus voltage characteristic. These steps occur at the voltages $nf/K_J$ where n is an integer, f is the microwave frequency and $K_J$=483,597.9 GHz/V which is the Josephson constant. By international agreement, these steps define the Système International d'Unités (SI) volt representation. Series arrays of Josephson junctions are used as voltage standards throughout the world. A typical Josephson voltage standard uses 20,000 or more junctions driven at 75 GHz to generate about 200,000 voltage steps from −14 to +14 volts.

Although these standards can be set to any one of approximately 200,000 steps, the procedure to select a particular step is so slow that the standards are useful only for dc measurements.

SUMMARY OF THE INVENTION

The present invention is a Josephson circuit that allows the rapid selection of any step number. The circuit has N digital inputs which define any one of $2^N$ linearly distributed output voltages and is therefore a digital-to-analog (D/A) converter whose output levels have the full accuracy of the SI Volt Representation. The circuit can be used to make fast voltage comparisons and to synthesize ac waveforms with a calculable RMS value. As a result it can be used to verify or even replace the thermal converters that are currently the standard for ac voltage measurement. It will also generate the dc voltages used in present Josephson voltage standards but with greater speed and convenience.

BRIEF DESCRIPTION OF THE DRAWING

The above-mentioned and other features and objects of the invention and the manner of attaining them will become more apparent and the invention itself will best be understood by reference to the following description of embodiments of the invention taken in conjunction with the accompanying drawing, a brief description of which follows.

FIG. 5 is an equivalent circuit for a large capacitance array segment with four Josephson junctions.

FIGS. 1 and 1A are the top view and profile in cross section of the physical layout for a large capacitance array segment with four Josephson junctions as shown in FIG. 5.

DESCRIPTION OF THE PREFERRED EMBODIMENT

Figure 1:
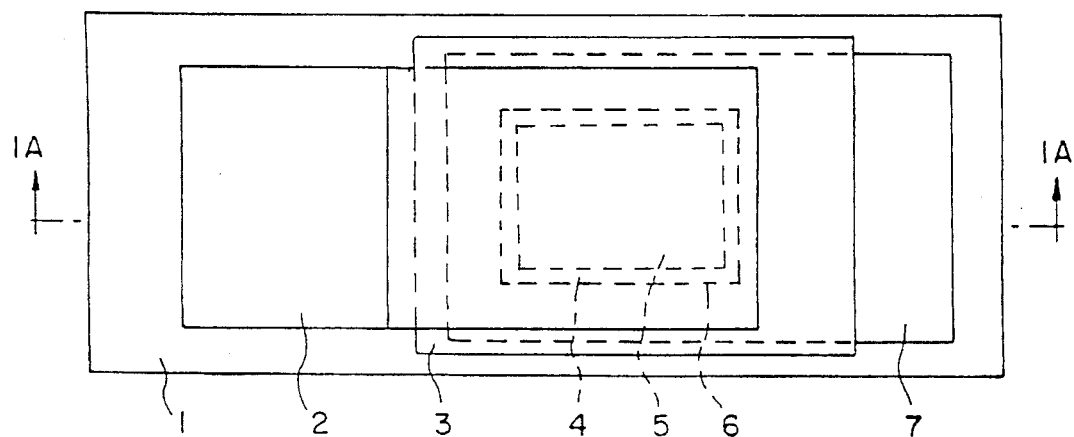
FIGS. 1 and 1A are the top view and profile in cross section of the construction of a typical prior art Josephson junction.

When reference is made to the drawing, like numerals will indicate like parts and structural features in the various figures.

Figure 1A:
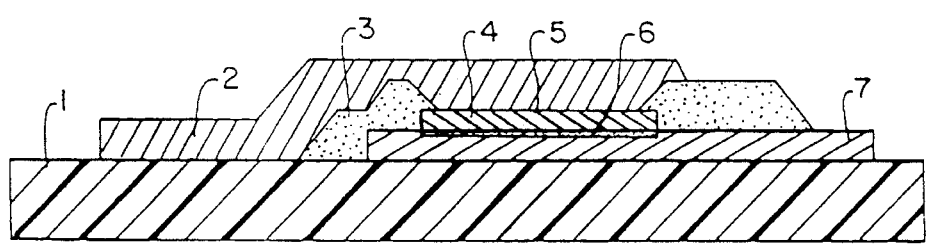

The basic active element of the present invention is a Josephson junction. A Josephson junction is formed when two superconductive metal films are separated by a thin insulating barrier. Since superconductive metal films are required, Josephson junctions necessarily operate at temperatures below the superconductive transition temperature of the metal—typically 77K or lower. A typical structure for a Josephson junction is shown in FIGS. 1 and 1A. It is fabricated by standard vacuum deposition and photolithography techniques on an inert substrate 1. Junctions are formed by a superconductive base electrode 7 that is coated with an oxide barrier 6, and then covered with a second superconductive counterelectrode 4 to form a trilayer structure. The oxide barrier is thin enough that an electrical current can tunnel from the base electrode through the oxide barrier to the counter electrode. Contact to the counter electrode 5 is made by a wiring layer 2 through an insulating window 3. The electrical characteristics of Josephson junctions are often modified by adding a shunting resistor in parallel with the junction, and hence referred to as shunted junctions.

Figure 2:
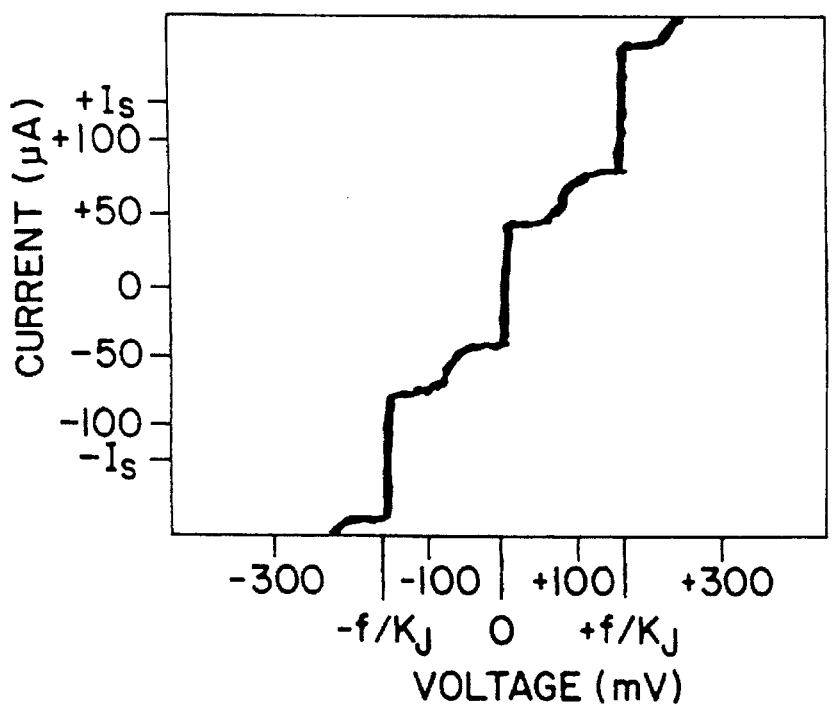
FIG. 2 is the current-voltage (I–V) curve of a shunted Josephson junction.
Figure 3:
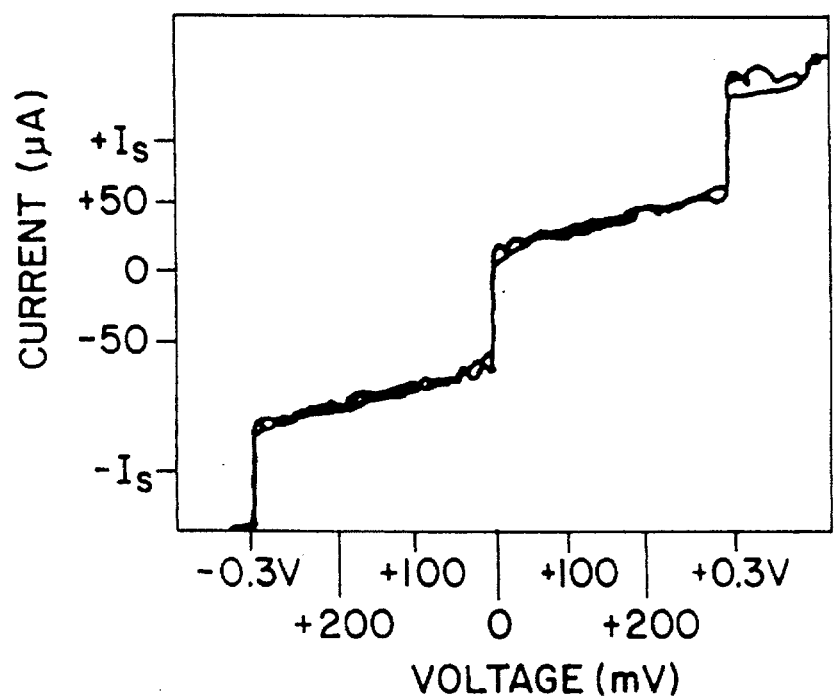
FIG. 3 is the I–V curve of 2048 shunted Josephson junctions connected in series.

The junctions and microwave drive used in the present invention are designed to generate a current-voltage (I–V) curve similar to that shown in FIG. 2. This curve is characteristic of a shunted Josephson junction driven by a microwave power source and a bias current $I_s$. It has three stable voltages, 0, $f/K_J$, and $−f/K_J$ which are uniquely selected by the bias currents 0, $+I_s$, and $−I_s$. The output voltage is exact for any input current within about ±20% of the nominal value. When N junctions similar to that described in FIG. 1 are connected in series, the steps occur at the voltages 0 and $±Nf/K_J$. FIG. 3 is a plot, resulting from an experiment using a reference frequency of 75 GHz, which shows the I–V curve of 2048 junctions in series. The steps occur at 0 and ±2048×(75 GHz /(483,597.9 GHz/V)=±0.3 V.

Figure 4:
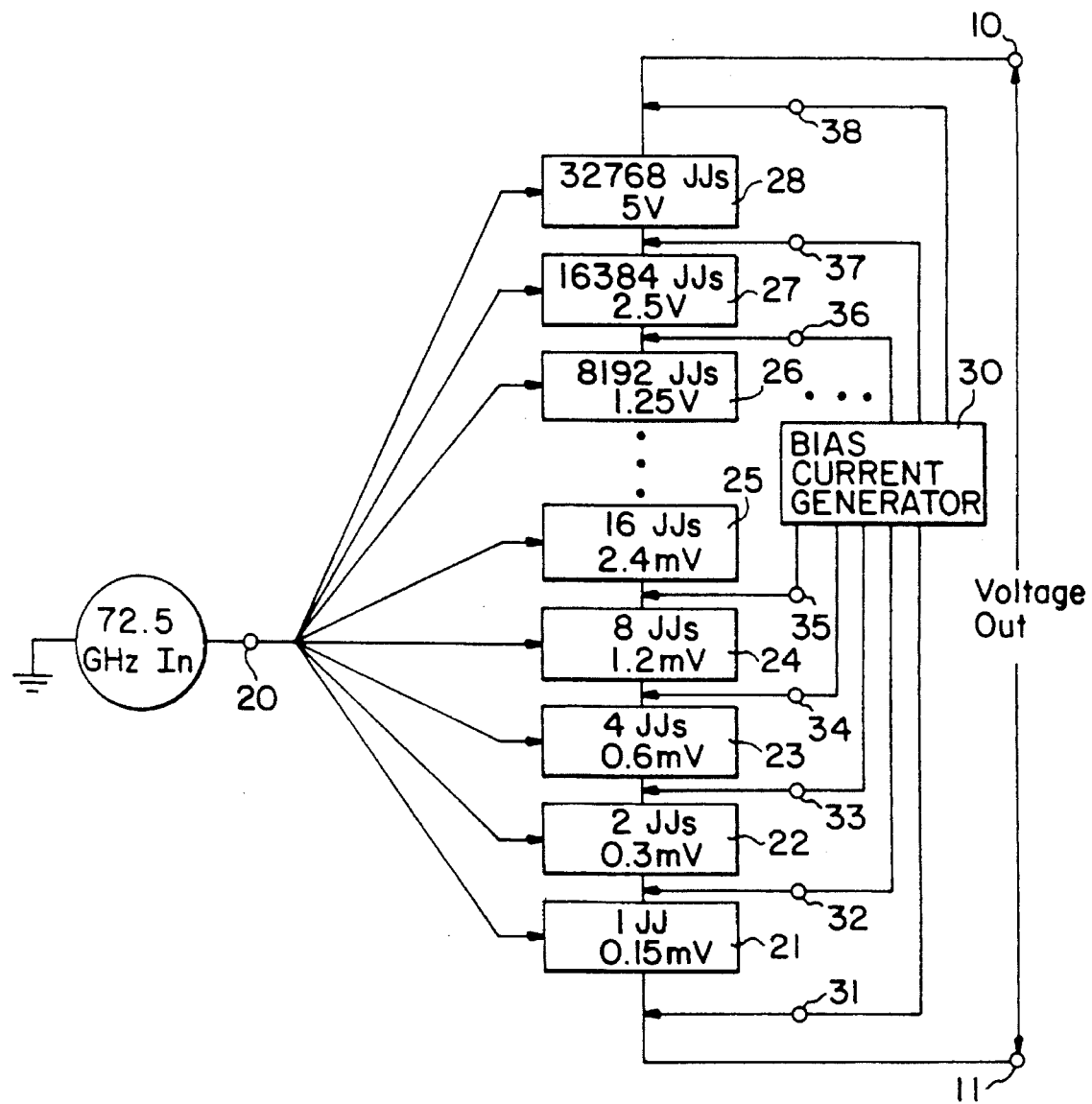
FIG. 4 is a block diagram of a Josephson D/A converter with 16-bit resolution and 28-bit accuracy according to the invention.

As shown in FIG. 4, the Josephson D/A converter consists of a binary sequence (1, 2, 4, 8, . . . , 32768) of independently biased array segments 21, 22, 23, 24, . . . , 28. Any given output voltage can be generated by applying bias currents from generator 30 to the appropriate set of array segments. For example, using the circuit of FIG. 4 with a microwave reference frequency of 72.5 GHz applied to terminal 20 and a resulting step separation of $f/K_J$=150 µV, a desired output voltage of 1.5 mV can be achieved by applying bias currents of $+I_s$ at terminals 33 and 35, and $−I_s$ at terminals 32 and 34, with all other bias currents set to zero. In this case the 2-junction array segment 22 will generate 0.3 mV and the 8-junction array segments 24 will generate 1.2 mV for a total of 1.5 mV appearing between terminal 10 and terminal 11.

The binary sequence of array segment lengths makes it possible to choose bias currents to generate a voltage $\pm Nf/K_J$ where N is any integer from 0 up to the total number of junctions in all array segments. Since the bias currents always have one of just three values they are digital inputs. The perfectly vertical steps in the junction I–V curves ensure that the output voltage will be exact over about a ±20% variation in $I_s$ from its nominal value.

The programmable voltage standard described herein requires an array of Josephson junctions having nearly identical I–V curves of the form shown in FIG. 2. In such an array, two basic requirements must be met. First, conditions must be such that a suitable I-V curve can be obtained in a single junction. Second, microwave power must be distributed uniformly enough that the I–V curves of all junctions will be essentially the same.

The following deals with the first basic requirement of obtaining a suitable I-V curve for a single junction. The ideal I-V curve for the present application is one with constant-voltage steps at V=0 and $V=f/K_J$ that extend over substantial nonoverlapping ranges of dc bias. The two steps should not overlap because the voltage must be selected using the dc bias. The bias ranges should be substantial to ensure the existence of a common dc bias at which all junctions of the array are in a given voltage state, even in the presence of small junction-to-junction variations. A large bias range also helps insure that the condition of phase lock is stable against thermal noise. In general, the bias ranges of the constant-voltage steps are largest when the junction parameters meet either the condition $$\frac{f}{K_J I_C R} \gg 1 \qquad (1)$$

or the condition $$\frac{2\pi f^2 C}{K_J I_C} \gg 1 \qquad (2)$$

where $I_C$ is the junction critical current, R is the shunt resistance, C is the shunt capacitance of the junction. When either of these conditions is met, the dc bias range of the n th step at voltage $V_n = nf/K_J$ is given by $$V_n/R - I_C |J_n(v_{rf})| > I > V_N/R + I_C |J_n(v_{rf})|, \qquad (3)$$

where $J_n$ is the $n^{th}$ order Bessel function and $v_{rf} = V_{rf}/V_1$ is the amplitude of the applied microwave voltage $V_{rf}$ normalized to the voltage of the first step. According to Eq. (3), the dc bias range or amplitude $\Delta I_n$ of the $n^{th}$ step is $$\Delta I_n = 2 I_C |J_n(v_{rf})|. \qquad (4)$$

Equations (1) through (4) provide the basic relations required to select appropriate junction parameters for the programmable array. To maximize the amplitudes of the n=0 and n=1 steps in the same I–V characteristic, $V_{rf}$ must have the value for which $|J_0(v_{rf})|$ and $|J_1(v_{rf})|$ are simultaneously maximum. This maximum occurs when $v_{rf}^* = 1.435$, for which argument $J_0 = J_1 = 0.5476$. These numbers define the optimum rf amplitude and the amplitude of the steps to be used in the programmable array. Applying Eq. (3) to this case, it can be seen that the n=0 and n=1 steps will overlap unless $$\frac{f}{K_J I_C R} > 2 J_0(v^*_{rf}) = 1.095. \qquad (5)$$

Thus, for best performance, the junctions used in the array should meet the condition expressed by Eq. (5) and at least one of the conditions given by Eqs. (1) and (2). The condition given by Eq. (5) generally cannot be met unless the junction is shunted by a small external resistance. For a bare tunnel junction, the relevant subgap $I_C R$ product is on the order of 10 mV. Since the step voltage $f/K_J$ is in the order of 0.1 mV at typical operating frequencies, the ratio $f/(K_J I_C R)$ is in the order of 0.01 for a bare junction and Eq. (5) is far from satisfied. Thus, each junction of the array must be shunted with a small external resistor to avoid overlap between constant voltage steps. Making the resistance of this external shunt as small as possible is advantageous because a smaller R allows a larger $I_C$ without violating Eq.(5), and the amplitude and stability of the steps grow with the critical current. The limits on R and $I_C$ depend on whether the objective is to satisfy Eq. (1) or Eq. (2). In the former case, the limit on R is determined by its parasitic series inductance L. If R is smaller than $2\pi fL$ then the condition given by Eq. (1) does not guarantee large amplitude steps. For an operating frequency of 75 GHz, the impedance of the parasitic inductance is generally not less than about 0.3 Ω, and the shunt resistance cannot be made smaller than this. In this case, Eq. (1) requires that $I_C$ be less than about 250 μA. Alternatively, the objective can be to satisfy Eq. (2) instead of Eq. (1). In this case, the parasitic inductance is irrelevant because only the dc component of the shunt impedance enters the condition given by Eq. (5). That is, the steps will be non-overlapping if R is small enough to satisfy Eq. (5), regardless of its parasitic inductance. In this case, the critical current is limited by Eq. (2). For given junction materials and operating frequency, this condition places a limit on the critical current density $J_C$ of the junction. For typical parameters, $J_C$ must be less than about 30 A/cm². When used as a voltage standard, the dimensions of the junction are limited to about 30 μm by the fact that the Fiske resonance must be well above the operating frequency. Combining the maximum critical current density with the maximum junction dimensions, again the maximum critical current is about 270 μA. Thus, whether the objective is to satisfy Eq. (1) or Eq. (2), the upper limit for the critical current is nearly the same. For both designs, the resulting $I_C$ of 250–270 μA provides good stability against thermal noise when the array is operated at 4K. The first design strategy has the advantage of allowing high critical current densities and small junction dimensions, which makes the array segment compact. However, as described below, the large-area high-capacitance junctions required for the second strategy simplify the problem of microwave distribution.

Regarding the second basic requirement, even if all of the junctions in an array are nearly identical, their I–V curves will be similar only if each receives roughly the same microwave power. The general strategy for obtaining an even power distribution is to couple each junction in an array segment to a microwave transmission line that parallels the array segment. If the transmission line carries much more power than the total required by all of the junctions, then the microwaves are not significantly attenuated between the beginning and the end of the array segment, and each junction receives nearly the same power. The transmission line is terminated by a matched load to prevent reflections that would lead to a standing wave. For an array segment in which the junctions satisfy Eq. (2), the junction capacitance is large enough that the array segment itself can be used as the microwave transmission line if it is fabricated over a superconducting groundplane.

The equivalent circuit and physical layout for such a large-capacitance array segment are shown in FIG. 5 and FIG. 6, respectively, which represent a four-junction group such as that depicted in circuit array segment 23 of FIG. 4.

In FIG. 5, a microwave power source 41, depicted here as a current source, is connected between terminal 33 and ground plane 10. A dc, or low frequency ac, current source 42 is connected between terminal 33 and terminal 34. Four Josephson junction cells, each comprising a junction 51–54, a resistor 61–64, and the capacitance of the junction 71–74, are connected in series via electrodes 43, 44, and 45. Inductors $L_s$ and capacitors $C_s$ are lumped elements representing the distributed inductance and capacitance of the physical structure of the network.

In operation, the structure of FIG. 5 behaves as a lumped element transmission line whose impedance is dominated by the distributed inductance and capacitance represented by $L_s$ and $C_s$. Microwave current from microwave source 41 propagates down the line inducing approximately the same microwave voltage across each junction 51–54. Microwave current at electrode 34 can continue on to more cells or, when the cell count exceeds about 1000, it is absorbed in a resistive matched load.

Current source 42 supplies bias current $I_s$ whose path is from terminal 34 through the four cells back through terminal 33 to source 42. Since $I_s$ is low frequency or dc, the distributed inductance and capacitance effects are negligible.

FIGS. 6 and 6A show a top view above a side view of a physical layout of the array segment described for FIG. 5. Numerals common to both FIG. 5 and FIGS. 6 and 6A indicate the same features. The Josephson junction construction is as described in FIG. 1; however, one added feature is the resistors 61–64. A second added feature is the ground plane 10 and dielectric 9, both of which underlie (but are not shown in) the entire top view. The resistors are formed by depositing a resistive material between electrodes 33 and 46, 46 and 44, 44 and 47, and between 47 and 34. Electrodes 46 and 47 are connected to electrodes 43 and 45 respectively by contact surfaces 48 and 49 respectively. The resistors are insulated from electrodes 43 and 45 by a layer of $SiO_2$ and from the ground plane 10 by dielectric 9. Dielectric 9 also provides insulation between ground plane 10 and electrodes 33, 46, 44, 47, and 34 as well as providing the dielectric for the distributed capacitances $C_s$.

The distributed inductance and capacitance per cell are represented by lumped elements $L_s$ and $C_s$. Although the array segment is periodically interrupted by Josephson junctions, it acts as a nearly ideal transmission line provided $$\frac{1}{\sqrt{L_s C}} \ll 2\pi f \ll \frac{1}{\sqrt{L_s C_s}} . \tag{6}$$

Thus, the array segment acts as a bandpass filter, and with appropriate choices for $L_s$ and $C_s$ it can be made to pass microwaves at the drive frequency. Such a choice is possible because the relatively large capacitance C of the junctions makes their impedance at microwave frequencies very small. The ratio of the microwave power $P_0$ on this transmission line to the power $P_J$ dissipated in one junction is approximately $$P_0/P_J = R(2\pi f C)^2 \sqrt{L_s/C_s} . \tag{7}$$

If N junctions are to be included in the array, then the inequality $$P_0/P_J > N \tag{8}$$

must be satisfied so that the total dissipation is much less than $P_0$. As Eq. (7) indicates, the large junction capacitance helps to make the ratio $P_0/P_J$ large. For typical parameters, of order 1000 junctions can be driven by a single microwave source. If more junctions are required, the microwave power can be split to drive several array segment segments separately. For an array in which the junctions satisfy Eq. (1), the optimum design uses small area junctions of low capacitance, and the simple microwave distribution system shown in FIGS. 5 and 6 cannot be used.

Figure 7:
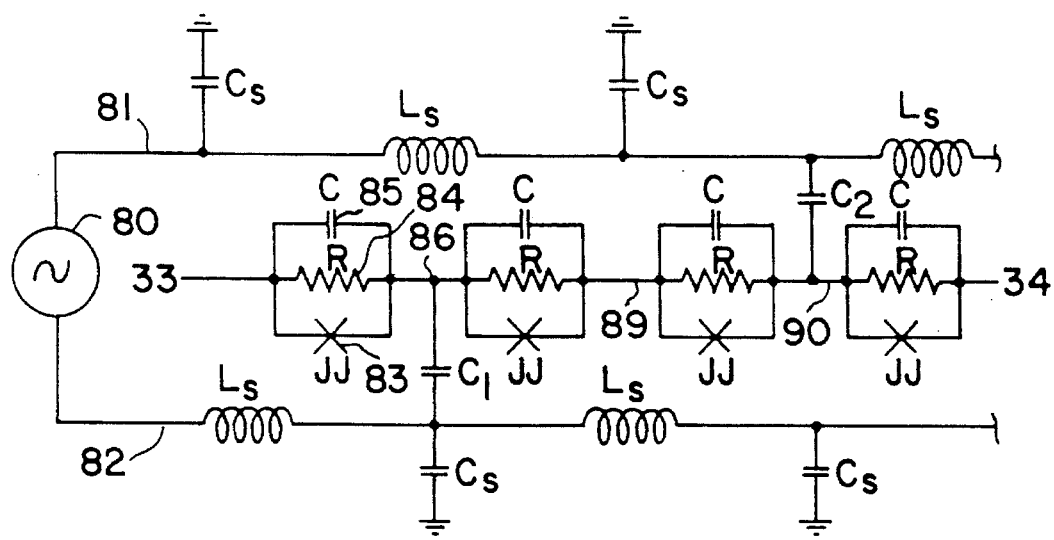
FIG. 7 is an equivalent circuit for a small junction array segment with four Josephson junctions.
Figure 8:
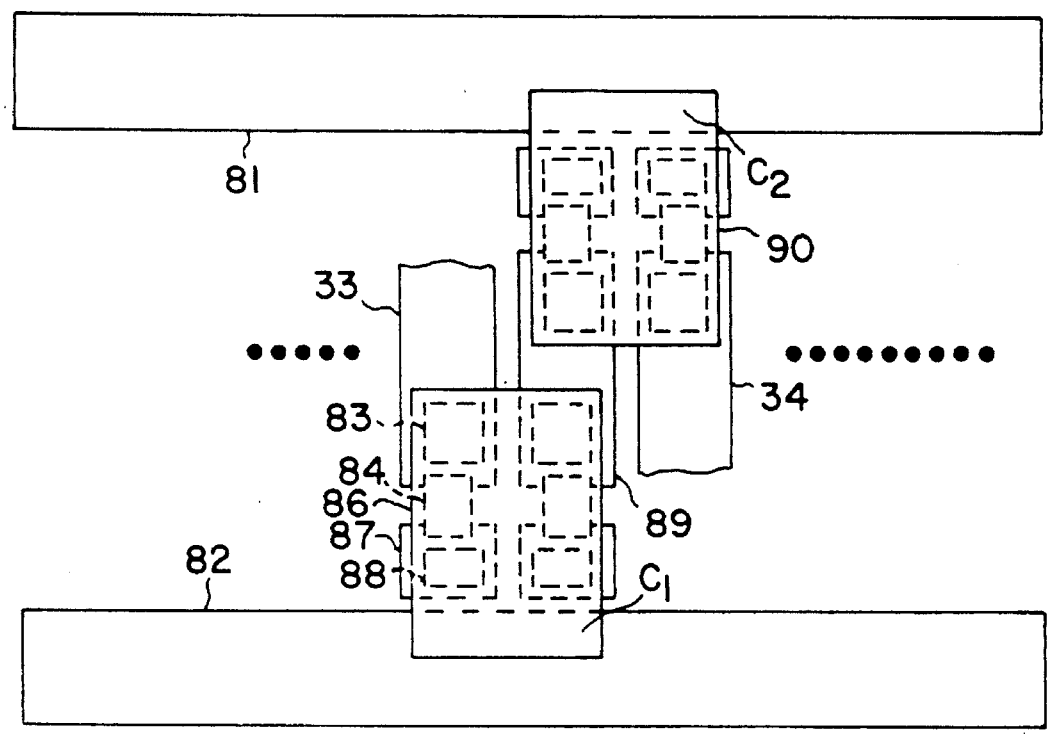
FIG. 8 is the top view of a physical layout for a small junction array segment with four Josephson junctions as shown in FIG. 7.

For the small junction case, a structure, like that shown in FIGS. 7 and 8, can be employed in which the junctions are weakly coupled to an ordinary transmission line. Here, the junctions are capacitively coupled to a pair of striplines that carry microwave power.

Referring to FIG. 7, a microwave source 80 is connected to striplines 81 and 82 whose distributed inductances and capacitances are represented by lumped elements $L_s$ and $C_s$. As in FIG. 5, each Josephson cell is represented by the parallel combination of R, C, and JJ. Capacitor $C_1$ is connected from stripline 82 to electrode 86 and capacitor $C_2$ is connected from stripline 81 to electrode 90. As in FIG. 5, a bias current source (not shown) is connected to terminals 33 and 34.

In operation, microwave power is coupled into the Josephson junction cells via capacitors $C_1$ and $C_2$ and electrodes 86 and 90. Otherwise, operation is as described as in the case for FIG. 5.

FIG. 8 is a top view of a physical layout of the circuit of FIG. 7. As previously stated, numerals common to FIGS. 7 and 8 represent the same elements. Striplines 81 and 82 are conductive strips lying on top of a dielectric layer over a ground plane (not shown). Electrode 89 corresponds to junction base electrode 44 in FIG. 6. Top electrodes 86 and 90 correspond to electrodes 43 and 45 in FIG. 6. Electrodes 86 and 90 overlie and are insulated from striplines 82 and 81 and thereby form capacitors $C_1$ and $C_2$ respectively. Capacitor 85 (C) represents the capacitance of junction 83 and resistor 84 is the shunting resistor for junction 83. Electrode 87 is connected to electrode 86 via contact 88. Each cell is replicated as necessary to produce the binary-weighted groups as described in FIG. 4.

Provided the coupling capacitance $C_1$ is small compared to the stripline capacitance $C_s$, this stripline pair will act as a nearly ideal transmission line. In this case, the drive power to dissipation ratio is $$P_0/P_J = \frac{8}{R \sqrt{L_s/C_s} \ (2\pi f C_1)^2} \tag{9}$$

and can be made as large as desired by using small coupling capacitors. Thus, the number of junctions that can be driven by a single microwave source is limited in this case by other sources of dissipation, such as dielectric and conduction losses along the stripline. Estimates of these losses indicate that more than 1000 small-area junctions can be driven from a single microwave source.

Figures 9, 9A:
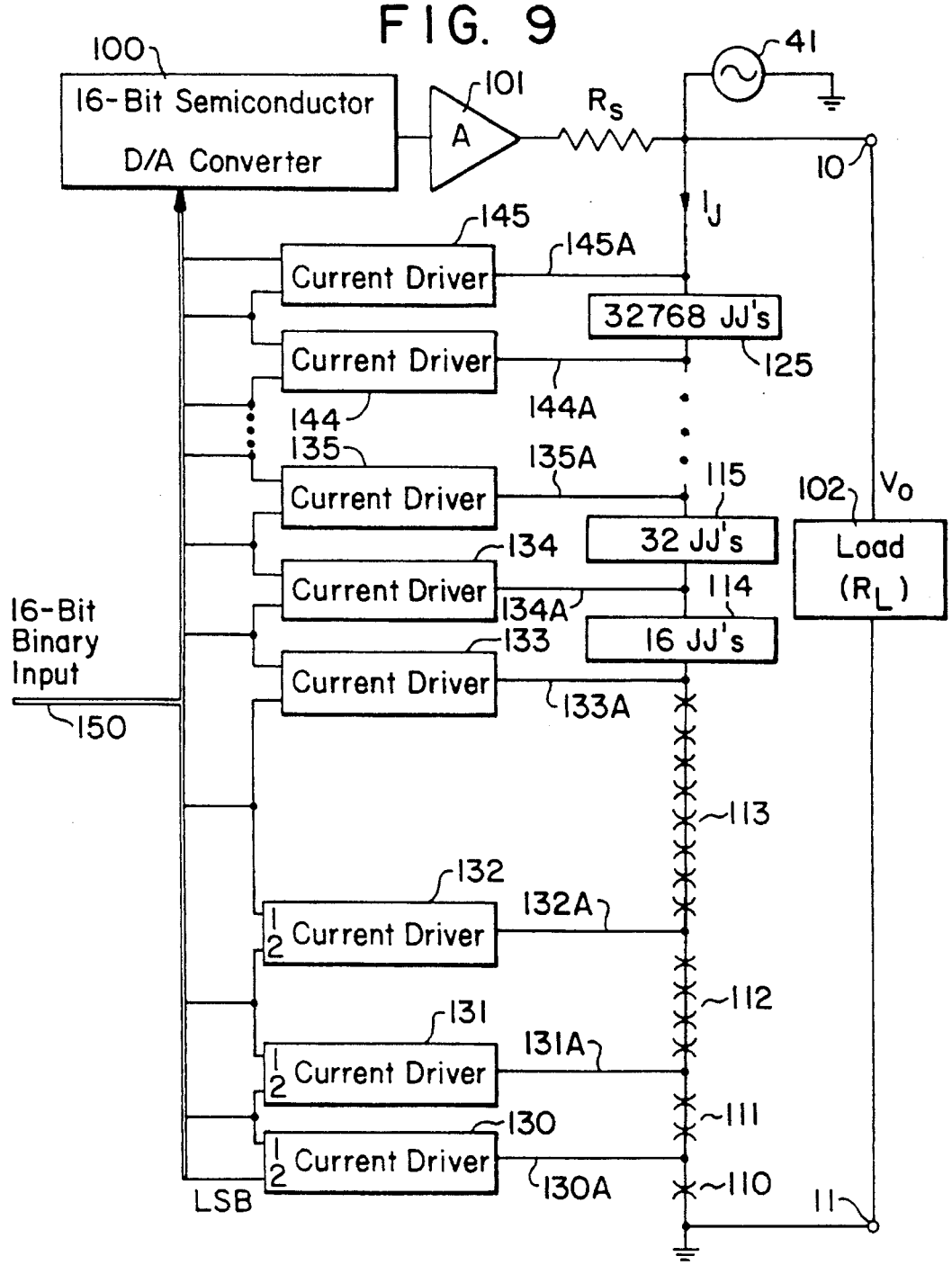
FIGS. 9 and 9A show a circuit and input signal scheme illustrating a semiconductor D/A converter with load compensation supplied by a Josephson D/A converter.

The circuit described so far has an important limitation because any current drawn at the output will shift the bias points of the junctions. Rather small load currents of a few tens of microamperes may shift one or more junctions to a non-quantized voltage. However, if the load impedance is known, most of the load current can be supplied by a semiconductor D/A converter which is programmed to deliver the predicted load current ($V_0/R_L$). The Josephson array then needs to supply only the difference between the predicted and actual load currents. The addition of a semiconductor D/A converter can increase the output current capability of the circuit by a factor of 10 to 100 with no loss in accuracy. FIG. 9 shows the Josephson D/A converter with load compensation. In FIG. 9, sixteen array segments 110–125 of Josephson junctions are connected to receive microwave power from source 41. The array segments are arranged in binary sequence with array segment 110 having one Josephson junction; array segment 111 having two Josephson junctions, array segment 112 having four junctions and so on through array segment 125, each segment having double the number of Josephson junctions found in the preceding array segment, so that array segment 125 has 32768 Josephson junctions. Each separate array segment 110–125 is connected to receive microwave power from microwave source 42.

Current drivers 130–146 are connected to supply bias current to each of the array segments 110–125 and provides current at one of three values, either $+I_s$, $-I_s$ or zero. As a result, if current 132A is $+I_s$ and current 131A is $-I_s$, the current flow through array segment 112 is $+I_s$. If current 132A is $+I_s$, current 131A is zero and current 130A is $-I_s$, array segments 112 and 111 will both carry bias current $+I_s$. If current 132A is $+I_s$ and currents 131A and 130A are zero, array segments 112, 111 and 110 will all carry bias current $+I_s$. When a segment is biased with a current value of $+I_s$, it will produce the Josephson voltage output.

Segment array 112, with four Josephson junctions, produces a discrete voltage of 0.6 mv as an output voltage. Thus, when bias current $+I_s$ flows through array segment 112 alone and is zero in all other segments, the output voltage across terminals 10 and 11 is 0.6 mv. When bias current $+I_s$ flows through array segments 111 and 112 together, but is zero in all other array segments, the output voltage is 0.9 mv. When bias current $+I_s$ flows through array segments 110–112 together, and in all other segments the bias current is zero, the voltage output is 1.05 mv. Thus as previously described with respect to FIG. 4, the output voltage of the Josephson converter of FIG. 9 can be increased in steps of 0.15 mv by properly selecting the bias current value for each of the array segments.

FIG. 9A shows the scheme for selecting bias current value. If only array segment 110 is to be selected, the digital input to the two input terminals of current driver 130 is zero-one; all other input signals to current drivers 111–125 are zero. If array segments 110 and 111 are to be selected together, current driver 131 would receive a digital input of zero-one on its two input terminals providing a current value of $+I_s$ for current 131A; current driver 130 would receive a digital input of one-one, giving a current 130A of zero. As a result, $+I_s$ flows through both array segments 110 and 111 to ground. If array segment 111 is to be selected alone, current driver 131 receives a digital input of zero-one giving a current 131A of $+I_s$ while current driver 130 receives a digital input of one-zero giving a current 130A of $-I_s$.

As described above, through use of the scheme shown in FIG. 9A with the circuit of FIG. 9, a sixteen bit binary input signal 150 is used to select the desired output voltage from the Josephson converter without a decoder. If some other digital input is used, it would be necessary to provide a decoder to obtain the proper digital input for current drivers 130–145. Similarly, if a different current driver circuit were used, a decoder would be required to decode the sixteen bit binary input signal and provide appropriate input signals to the current driver. The current driver circuit shown in FIG. 9 is matched to the binary input signal 150 to obviate the need for a decoder.

The semiconductor D/A converter 100 receives the same input signal 150 as the Josephson converter. Assuming that the semiconductor D/A converter 100 generates nominally the same voltage as the Josephson array, then the values for the gain A of amplifier 101 and the series resistance $R_s$ are given by $$A = \frac{R_s + R_L}{R_L}, \tag{10}$$

and $$R_s > \frac{R_L \Delta}{R_L I_J - \Delta}, \tag{11}$$

where $\Delta$ is the maximum absolute error in the D/A output and $I_J$ is the maximum allowable load current on the array. For example, if the resistance $R_L$ of load 102, $R_L$=1000 Ω, $I_J$=10 μA and $\Delta$=1 mV then the values $R_s$=200 Ω and A=1,200 would guarantee error free operation. Equation (11) shows that the load compensation will work only as long as the maximum allowable D/A error $\Delta$ is less than $R_L I_J$. With load compensation, it can be seen that the Josephson part of the circuit acts as a trimmer to adjust the semiconductor D/A converter output voltage a few tenths of a percent. Its effect is to improve the accuracy of the semiconductor D/A converter from typically 0.1% to the 0.01 ppm accuracy of the Josephson standard.

WORKING EXAMPLE

Figure 10A:
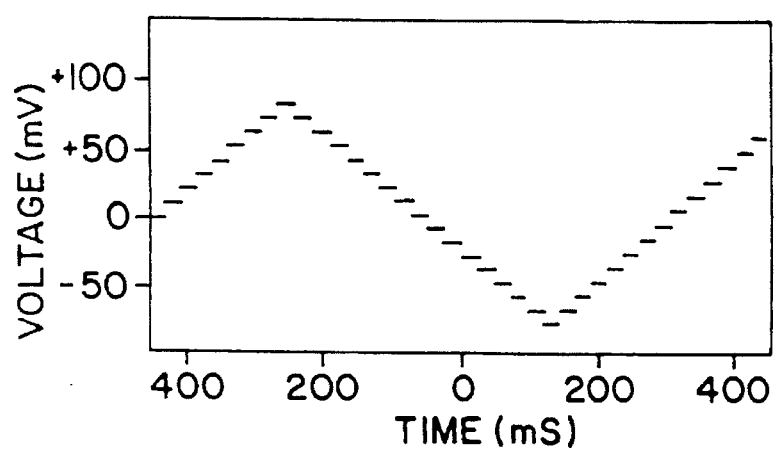
FIGS. 10A–10D show plots of digitally synthesized triangle waveforms from the Josephson D/A converter of FIG. 4.
Figure 10B:
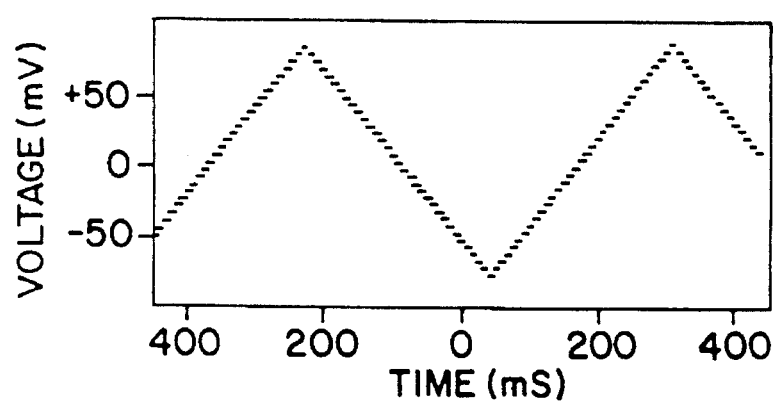
Figure 10C:
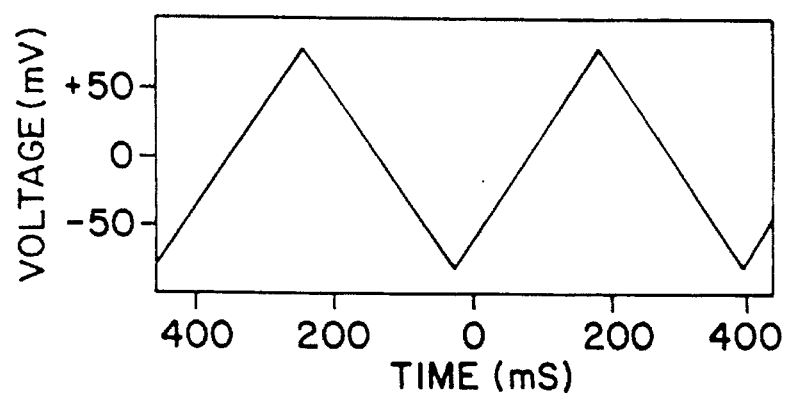
Figure 10D:
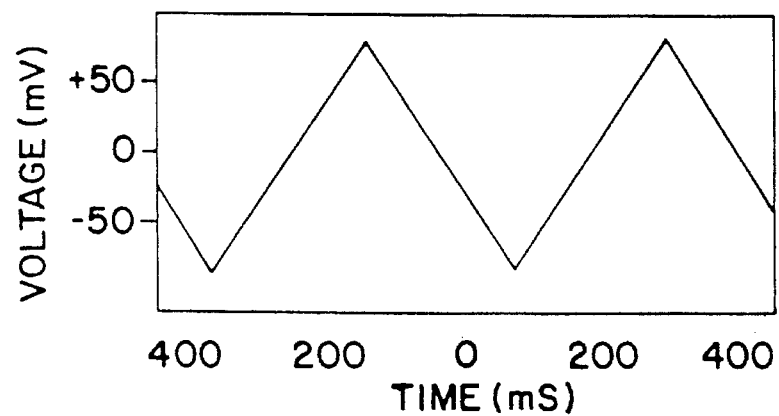

A 14-bit version of the circuit shown in FIG. 4 has been fabricated and tested. The first 9 bits are fully functional leading to a maximum output voltage of ±77 mV with 0.15 mV resolution. The accuracy of the output has been confirmed to ±1 μV. FIG. 10A shows a synthesized ±77 mV triangle wave using the most significant 4 bits of the 9 bit converter. FIGS. 10B, 10C, and 10D show the result with the 5, 6, and 7 most significant bits in operation. Load compensation was not required for this data because the D/A output was connected only to the 1 MΩ oscilloscope input. The triangle wave frequency in the data of FIG. 10 is entirely limited by the automated test system used to drive the Josephson D/A input. The Josephson D/A converter should be capable of input sample rates greater than 1 MHz.

While the invention has been described above with respect to specific embodiments, it will be understood by those of ordinary skill in the art that various changes in form and details may be made therein without departing from the spirit and scope of the invention which receives definition in the following claims.

What is claimed is:

1. A Josephson digital-to-analog (D/A) converter with voltage accuracy defined by the Josephson frequency to voltage relationship, comprising:

a plurality of series connected array segments wherein each of said segments include one or more voltage generating Josephson junctions connected in series, and wherein each array segment generates one of several discrete voltages in accordance with said Josephson relationship;

a source of microwave power coupled to said voltage generating Josephson junctions for distributing power at a reference frequency to said junctions; and selection means connected to each of said array segments to select the output voltage across said plurality of array segments to provide a desired voltage output from said Josephson D/A converter.

2. The Josephson D/A converter of claim 1 wherein said selection means includes bias current generating means for providing various bias current values for said array segments in accordance with selection.

3. The Josephson D/A converter of claim 2 wherein said array segments contain different numbers of junctions in binary sequence.

4. The Josephson D/A converter of claim 3 connected in parallel to a semiconductor D/A converter designed to provide a calculated power output for a known load, said Josephson D/A converter designed to provide a trimming output to improve the voltage accuracy of said semiconductor D/A converter to the accuracy of the Josephson voltage standard.

5. The Josephson D/A converter of claim 4 wherein said microwave power is directly coupled to said Josephson junctions.

6. The Josephson D/A converter of claim 5 wherein said Josephson junctions are fabricated over a grounded conductor and wherein said microwave power is directly connected to said grounded conductor and to the first of the series connected Josephson junctions in said array segment.

7. The Josephson D/A converter of claim 5 wherein the parameters of each Josephson junction in said converter meets the condition $$\frac{2\pi f^2 C}{K_J I_C} \gg 1$$

where $I_C$ is the junction critical current, C is the shunt capacitance of the junction, f is said reference frequency, and $K_J$ is the Josephson constant.

8. The Josephson D/A converter of claim 4 wherein said microwave power is capacitively coupled to said Josephson junctions.

9. The Josephson D/A converter of claim 8 wherein Josephson junctions in each array segment are fabricated with conductive strips overlying a ground plane and wherein said microwave power is directly connected to said conductive strips and capacitively coupled to said Josephson junctions.

10. The Josephson D/A converter of claim 9 wherein the parameters of each Josephson junction in said converter meets the condition $$\frac{f}{K_J I_C R} \gg 1$$

where $I_C$ is junction critical current, R is the shunt resistance, f is said reference frequency, and $K_J$ is the Josephson constant.

11. The Josephson D/A converter of claim 3 wherein said microwave power is directly coupled to said Josephson junctions.

12. The Josephson D/A converter of claim 11 wherein said Josephson junctions are fabricated over a grounded conductor and wherein said microwave power is directly connected to said grounded conductor and to the first of the series connected Josephson junctions in said array segment.

13. The Josephson D/A converter of claim 12 wherein the parameters of each Josephson junction in said converter meets the condition $$\frac{2\pi f^2 C}{K_J I_C} \gg 1$$

where $I_C$ is the junction critical current, C is the shunt capacitance of the junction, f is said reference frequency, and $K_J$ is the Josephson constant.

14. The Josephson D/A converter of claim 3 wherein said microwave power is capacitively coupled to said Josephson junctions.

15. The Josephson D/A converter of claim 14 wherein Josephson junctions in each array segment are fabricated with conductive strips overlying a ground plane and wherein said microwave power is directly connected to said conductive strips and capacitively coupled to said Josephson junctions.

16. The Josephson D/A converter of claim 15 wherein the parameters of each Josephson junction in said converter meets the condition $$\frac{f}{K_J I_C R} \gg 1$$

where $I_C$ is junction critical current, R is the shunt resistance, f is said reference frequency, and $K_J$ is the Josephson constant.

* * * * *